United States Patent
Jang et al.

(10) Patent No.: US 10,364,391 B2
(45) Date of Patent: Jul. 30, 2019

(54) QUANTUM DOT, QUANTUM DOT FILM AND LED PACKAGE AND DISPLAY DEVICE INCLUDING THE SAME

(71) Applicant: LG Display Co., Ltd., Seoul (KR)

(72) Inventors: Kyung-Kook Jang, Paju-si (KR); Byung-Geol Kim, Paju-si (KR); Wy-Yong Kim, Seoul (KR); Kyu-Nam Kim, Paju-si (KR); Hee-Yeol Kim, Paju-si (KR); Sung-Il Woo, Paju-si (KR); Do-Hyung Kim, Seoul (KR); Tae-Yang Lee, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 187 days.

(21) Appl. No.: 15/249,322

(22) Filed: Aug. 26, 2016

(65) Prior Publication Data
US 2017/0058199 A1    Mar. 2, 2017

(30) Foreign Application Priority Data

Aug. 31, 2015    (KR) .................. 10-2015-0123213

(51) Int. Cl.
  *B82Y 20/00*    (2011.01)
  *B82Y 40/00*    (2011.01)
  (Continued)

(52) U.S. Cl.
  CPC ............ *C09K 11/883* (2013.01); *C09K 11/02* (2013.01); *C09K 11/025* (2013.01);
  (Continued)

(58) Field of Classification Search
  CPC ..... C09K 11/883; C09K 11/02; C09K 11/025; C09K 11/0883; C09K 11/565;
  (Continued)

(56) References Cited

U.S. PATENT DOCUMENTS

| 8,309,170 B2 | 11/2012 | Jang et al. |
| 9,368,740 B2 | 6/2016 | Tang et al. |

(Continued)

FOREIGN PATENT DOCUMENTS

| CN | 102903855 A | 1/2013 |
| CN | 103911142 A | 7/2014 |

(Continued)

OTHER PUBLICATIONS

Kim, S. et al., "Highly Luminescent InP/GaP/ZnS Nanocrystals and Their Application to White Light-Emitting Diodes," *Journal of the American Chemical Society*, 2012, pp. 3804-3809, vol. 134.

(Continued)

*Primary Examiner* — Mary Ellen Bowman
(74) *Attorney, Agent, or Firm* — Fenwick & West LLP

(57) ABSTRACT

A quantum dot includes a seed and a core enclosing the seed. The core is grown from the seed to improve size uniformity of the core. The seed includes a first compound without Cd. The first compound may be GaP. The core may include a second compound including elements from group XIII and group XV. The second compound may be InP. The quantum dot may also include a first shell of a third compound enclosing the core. The third compound may be ZnSe or ZnS. The quantum dot may also include a second shell of a fourth compound enclosing the first shell. The fourth compound may be ZnS when the third compound is ZnSe. Embodiments also relate to a quantum dot including first to third elements selected from XIII group elements and XV group elements and fourth to sixth elements selected from XII group elements and XVI group elements.

40 Claims, 10 Drawing Sheets

(51) Int. Cl.
*C09K 11/02* (2006.01)
*C09K 11/08* (2006.01)
*C09K 11/56* (2006.01)
*C09K 11/70* (2006.01)
*C09K 11/88* (2006.01)
*H01L 27/15* (2006.01)
*H01L 27/32* (2006.01)
*H01L 33/50* (2010.01)
*H05B 33/14* (2006.01)
*G02F 1/1335* (2006.01)
*G02F 1/1368* (2006.01)
*G02F 1/13357* (2006.01)

(52) U.S. Cl.
CPC ........ *C09K 11/0883* (2013.01); *C09K 11/565* (2013.01); *C09K 11/70* (2013.01); *C09K 11/885* (2013.01); *G02F 1/1336* (2013.01); *G02F 1/133603* (2013.01); *G02F 1/133609* (2013.01); *H01L 27/15* (2013.01); *H01L 27/322* (2013.01); *H01L 33/502* (2013.01); *H01L 33/504* (2013.01); *H05B 33/14* (2013.01); *B82Y 20/00* (2013.01); *B82Y 40/00* (2013.01); *G02F 1/1368* (2013.01); *G02F 2001/133614* (2013.01); *G02F 2202/36* (2013.01); *H01L 2224/48091* (2013.01); *H01L 2224/48247* (2013.01); *H01L 2224/48257* (2013.01); *H01L 2924/181* (2013.01); *H01L 2933/0083* (2013.01); *Y10S 977/774* (2013.01); *Y10S 977/825* (2013.01); *Y10S 977/89* (2013.01); *Y10S 977/95* (2013.01); *Y10S 977/952* (2013.01)

(58) Field of Classification Search
CPC ..... C09K 11/70; C09K 11/885; G02F 1/1336; G02F 1/133603; G02F 1/133609; H01L 27/15; H01L 27/322; H01L 33/50; H01L 33/502; H01L 33/504; H05B 33/14
See application file for complete search history.

(56) References Cited

U.S. PATENT DOCUMENTS

| | | | |
|---|---|---|---|
| 2007/0057263 A1* | 3/2007 | Kahen | B82Y 10/00 257/79 |
| 2014/0192291 A1* | 7/2014 | Kang | G02F 1/133621 349/62 |
| 2014/0264172 A1 | 9/2014 | Daniels et al. | |
| 2015/0279934 A1 | 10/2015 | Tang et al. | |

FOREIGN PATENT DOCUMENTS

| | | |
|---|---|---|
| EP | 2680069 A1 | 1/2014 |
| KR | 10-2013-0022639 A | 3/2013 |

OTHER PUBLICATIONS

European Patent Office, Search Report and Opinion, European Patent Application No. 16186285.9, dated Nov. 16, 2016, nine pages.

Greco, T. et al., "InP/ZnSe/ZnS core multi-shell quantum dots for improved luminescence efficiency," *Nanophotonics IV, Proc. of SPIE*, vol. 8424, No. 1, May 3, 2012, nine pages.

China National Intellectual Property Administration, First Office Action, CN Patent Application No. 201610754547.X, dated Dec. 4, 2018, 20 pages.

United States Office Action, U.S. Appl. No. 15/249,302, dated Mar. 25, 2019, eight pages.

* cited by examiner

QUANTUM DOT, QUANTUM DOT FILM AND LED PACKAGE AND DISPLAY DEVICE INCLUDING THE SAME

CROSS-REFERENCE TO RELATED APPLICATIONS

This application claims priority to and the benefit of Republic of Korea Patent Application No. 10-2015-0123213 filed in the Republic of Korea on Aug. 31, 2015, which is hereby incorporated by reference in its entirety.

BACKGROUND OF THE INVENTION

Field of the Invention

Embodiments of the invention relate to a quantum dot, and more particularly, to a quantum dot having high color purity and an eco-friendly property, and a quantum dot film, a light emitting diode (LED) package, and a display device including the same.

Discussion of the Related Art

Recently, as society has entered in earnest upon an information age, a field of display devices that represent all sorts of electrical signals as visual images has developed rapidly. For example, a flat panel display device, such as a liquid crystal display (LCD) device, a plasma display panel (PDP) device, a field emission display (FED) device, and an organic light emitting diode (OLED) device, has been introduced.

On the other hand, use of quantum dots (QD) to display devices has been researched or studied. In the QD, an electron in an unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

FIG. 1 is a schematic view illustrating the related art QD.

As shown in FIG. 1, the QD 1 includes a core 10 and a shell 20. Generally, cadmium selenide (CdSe) is widely used for the core 10. The QD 1 including the CdSe core 10 has an advantage in color purity.

However, cadmium (Cd) is harmful, and there is restriction in the use of the Cd.

SUMMARY OF THE INVENTION

Accordingly, embodiments of the invention are directed to a QD, a QD film and an LED package and a display device including the same that substantially obviate one or more of the problems due to limitations and disadvantages of the related art, and have other advantages.

An objective of the invention is to provide a Cd-free QD and a QD film, an LED package and a display device including the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Embodiments also relate to a quantum dot including a seed and a core enclosing the seed. The seed includes a first compound without Cd, and the core is of a second compound including InP.

Embodiments also relate to a method of manufacturing a quantum dot. The method includes forming a seed including a first compound without Cd, and growing a core from the seed to enclose the seed. The core is formed of a second compound including InP.

Embodiments also relate to a quantum dot film including a binder, and a quantum dot in the binder. The quantum dot includes including a seed and a core enclosing the seed. The seed includes a first compound without Cd, and the core is of a second compound including InP.

Embodiments also relate to a liquid crystal display device including a backlight unit configured to emit light, a quantum dot film disposed on the backlight unit, and a liquid crystal panel disposed on the quantum dot film. The quantum dot film includes a quantum dot, the quantum dot including a seed and a core enclosing the seed. The seed includes a first compound without Cd, and the core is of a second compound including InP.

Embodiments also relate to a light emitting diode (LED) package including a LED chip and an encapsulation part covering the LED chip. The encapsulation part includes a quantum dot, the quantum dot including a seed and a core enclosing the seed. The seed includes a first compound without Cd, and the core is of a second compound including InP.

Embodiments also relate to a liquid crystal display device including a backlight unit and a liquid crystal panel on the backlight unit. The backlight unit includes a LED chip and an encapsulation part covering the LED chip. The encapsulation part includes a quantum dot, the quantum dot including a seed and a core enclosing the seed. The seed includes a first compound without Cd, and the core is of a second compound including InP.

Embodiments also relate to a light emitting diode display device including a substrate, a thin film transistor (TFT) on the substrate, and a light emitting diode electrically connected to the TFT. The light emitting diode includes a first electrode connected to the TFT, an organic emitting layer on the first electrode, and a second electrode on the organic light emitting layer. The organic emitting layer includes a quantum dot, the quantum dot including a seed and a core enclosing the seed. The seed includes a first compound without Cd, and the core is of a second compound including InP.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

As defined in the specification herein, "XII group elements" refer to elements in group XII of the periodic table. For example, XII group elements may be any one or more of Zn, Cd, Hg, and Cn. "XIII group elements" refer to elements in group XIII of the periodic table. For example, XIII group elements may be any one or more of B, Al, Ga, In, and Tl. "XV group elements" refer to elements in group XV of the periodic table. For example, XV group elements may be any one or more of N, P, As, Sb, and Bi. "XVI group elements" refer to elements in group XVI of the periodic table. For example, XVI group elements may be any one or more of O, S, Se, Te, and Po.

A compound of the "XIII-XV group" refers to a compound including at least a XIII group element and a XV group element. A compound of the "XII-XVI group" refers to a compound including at least a XII group element and a XVI group element.

A quantum dot (QD) according to a first embodiment of the present disclosure includes first and second elements respectively selected from the XIII group elements and the XV group elements in the periodic table and third and fourth elements respectively selected from the XII group elements and the XVI group elements in the periodic table. For example, the first and second elements may form a first compound of the XIII-XV group, and the third and fourth elements may form a second compound of the XII-XVI group.

The first element may be indium (In), and the second element may be phosphorus (P). The third element may be zinc (Zn), and the fourth element may be sulfur (S). Namely, the first compound of the XIII-XV group may be InP, and the second compound of the XII-XVI group may be ZnS. A first compound layer of the first compound may be enclosed with a second compound layer of the second compound.

Since the QD of the first embodiment of the present disclosure includes the InP core instead of the CdSe core, the harmful problem of the related art QD is overcome.

Synthesis of QD

InR$_3$ (R=palmitic acid, 1 mmol) and 1-octadecene (50 mL) were put into the 250 mL flask, and the mixture was stirred in vacuum condition under the temperature of 150° C. for 1 hour. Next, tris(trimethylsilyl)phosphine (1 mmol) and 1-octadecene (5 mL) were injected into the mixture in the vacuum condition under the temperature of 300° C., and they were stirred under the temperature of 300° C. for 10 minutes. ZnR$_3$ (R=palmitic acid) and 1-dodecanethiol were injected into the mixture, and they were stirred under the temperature of 300° C. for 1 hour. After completion of the reaction, the mixture was cooled into the room temperature. The mixture was purified by the precipitation method using toluene and methanol such that the QD was obtained.

Figure 1:
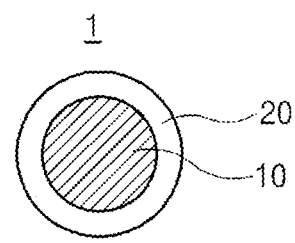
FIG. 1 is a schematic view illustrating the related art QD.
Figure 2A:
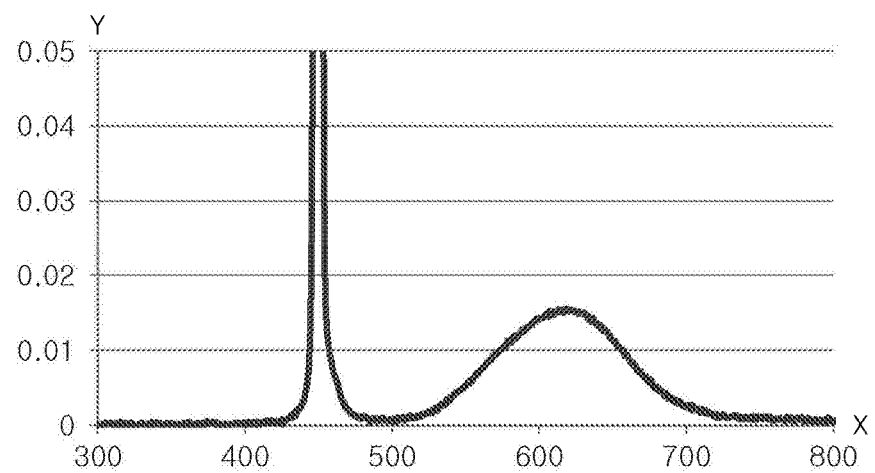
FIGS. 2A and 2B are views showing properties and components of a QD according to a first embodiment of the present disclosure.
Figure 2B:
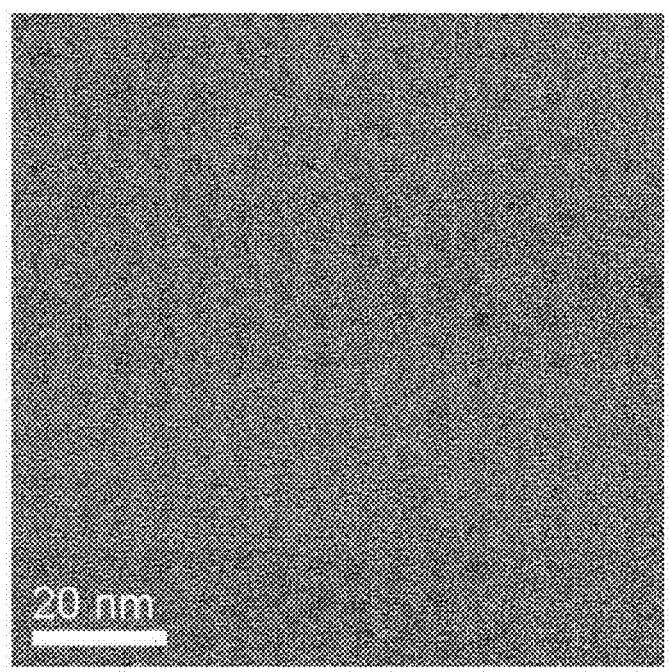

FIG. 2A is a photoluminescence (PL) spectrum of the QD, and FIG. 2B is a transmission electron microscopy (TEM) of the QD.

The x-axis of FIG. 2A indicates the wavelength of the luminescence in nm, and the y-axis of FIG. 2A indicates the photoluminescence intensity. As shown in FIG. 2A, the QD emits the visible light of the red wavelength range.

Namely, the QD includes the first and second elements, which are respectively selected from the XIII group elements and the XV group elements, and the third and fourth elements, which are respectively selected from the XII group elements and the XVI group elements, without Cd and emits the red visible light.

The STEM/EDS component analysis data are listed in Table 1. The X-Max 80 TLE apparatus is used in the analysis. When the constant value in Table 1 is larger than 1.5, the element is detected.

TABLE 1

|  | In | P | Zn | S | Se | Ga |
|---|---|---|---|---|---|---|
| Kα, Lα | 24.029, 3.286 | 2.013 | 8.637, 1.012 | 2.037 | 11.220, 1.379 | 9.250, 1.093 |
| Count/base | —, 67/6 | 33/6 | 36/6, 287/6 | 59/6 | — | — |
| constant | —, 11.2 | 5.5 | 6, 47.8 | 9.8 | — | — |

Since the InP compound as the first compound in the QD has smaller particle size and broader particle size distribution than CdSe compound, the color purity is decreased. Namely, since the surface area of the InP core is increased, the surface energy of the InP core becomes higher. As a result, there are defect sites in the surface of the InP core or the QD such that the trap emission is generated in the QD. Accordingly, in the QD according to the first embodiment of the present disclosure, the emission range is increased, and the color purity is decreased.

A QD according to the second embodiment of the present disclosure includes first and second elements respectively selected from the XIII group elements and the XV group elements in the periodic table and third to fifth elements respectively selected from the XII group elements and the XVI group elements in the periodic table. For example, the first and second elements may form a first compound of the XIII-XV group, the third and fourth elements may form a second compound of the XII-XVI group, and the third and fifth elements may form a third compound, which is different from the second compound, of the XII-XVI group.

The first element may be indium (In), and the second element may be phosphorus (P). The third element may be zinc (Zn), the fourth element may be selenium (Se), and the fifth element may be sulfur (S). Namely, the first compound of the XIII-XV group may be InP, the second compound of the XII-XVI may be ZnSe, and the third compound of the XII-XVI group may be ZnS. A first compound layer of the first compound may be enclosed with a second compound layer of the second compound, and the second compound layer may be enclosed with a third compound layer of the third compound. Namely, the second compound layer may be positioned between the first and third compound layers.

Since the QD of the second embodiment of the present disclosure includes the InP core instead of the CdSe core, the harmful problem of the related art QD is overcome.

Synthesis of QD $InR_3$ (R=palmitic acid, 1 mmol) and 1-octadecene (50 mL) were put into the 250 mL flask, and the mixture was stirred in the vacuum condition under the temperature of 150° C. for 1 hour. Next, in the vacuum condition and under the temperature of 300° C., tris(trimethylsilyl)phosphine (1 mmol) was injected to grow for 30 minutes. After the solution became black, 1-dodecanethiol (1 mmol) was injected, and Se-trioctylphosphine (Se-TOP, 0.1 mmol) was additionally injected. The mixture was stirred under the temperature of 300° C. and was cooled into room temperature.

$ZnR_3$ (R=palmitic acid, 1 mmol) was injected into the mixture and stirred under the temperature of 250° C. for 2 hours. After completion of stirring, the mixture was cooled into room temperature, and 1-dodecanethiol was injected and stirred under the temperature of 250° C. for 2 hours. After completion of the reaction, the mixture was cooled into room temperature. The mixture was purified by the precipitation method using toluene and methanol such that the QD was obtained.

Figure 3A:
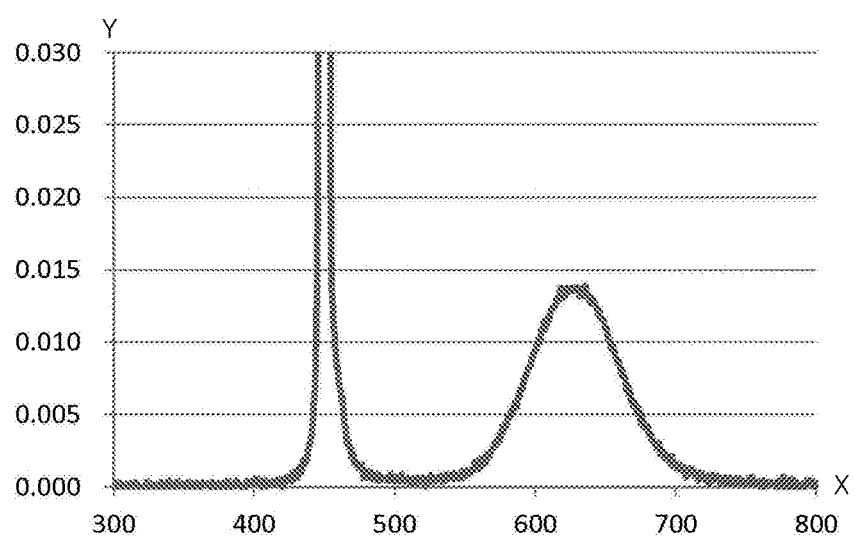
FIGS. 3A and 3B are views showing properties and components of a QD according to a second embodiment of the present disclosure.
Figure 3B:
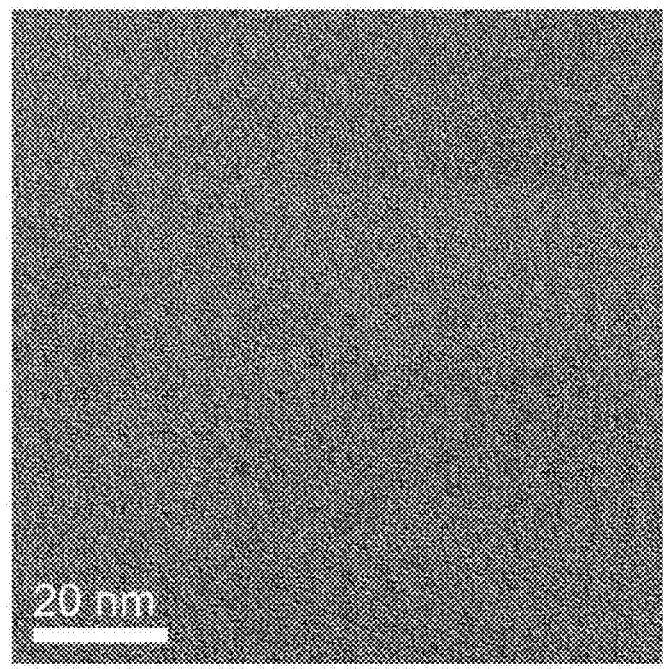

The x-axis of FIG. 3A indicates the wavelength of the luminescence in nm, and the y-axis of FIG. 3A indicates the photoluminescence intensity. FIG. 3A is a photoluminescence (PL) spectrum of the QD, and FIG. 3B is a transmission electron microscopy (TEM) of the QD.

As shown in FIG. 3A, the QD emits the visible light of the red wavelength range

Namely, the QD includes the first and second elements, which are respectively selected from the XIII group elements and the XV group elements, and the third to fifth elements, which are respectively selected from the XII group elements and the XVI group elements, without Cd and emits the red visible light.

The STEM/EDS component analysis data are listed in Table 2. The X-Max 80 TLE apparatus is used in the analysis. When the constant value in Table 2 is larger than 1.5, the element is detected.

TABLE 2

|  | In | P | Zn | S | Se | Ga |
|---|---|---|---|---|---|---|
| Kα, Lα | 24.029, 3.286 | 2.013 | 8.637, 1.012 | 2.037 | 11.220, 1.379 | 9.250, 1.093 |
| Count/base | —, 18/3 | 18/3 | 75/3, 220/3 | 110/3 | 9/3, 40/3 | — |
| constant | —, 6 | 6 | 25, 73.3 | 36.7 | 3, 13.3 | — |

Referring to FIG. 3A, a full width at half maximum (FWHM) of the PL spectrum of the QD according to the second embodiment of the present disclosure is reduced in comparison to that of the QD according to the first embodiment of the present disclosure. However, since the FWHM of the QD according to the second embodiment of the present invention is broader than the related art Cd-containing QD, there is still disadvantage in the color purity.

A QD according to the third embodiment of the present disclosure includes a seed including a first compound without Cd, and a core of a second compound enclosing the seed. The first compound may be a compound of the XIII-XV group, such as GaP. The second compound of the core does not include Cd and is different from the first compound. The second compound may also be a compound of the XIII-XV group, such as InP. The seed of the first compound is used to grow the core of the second compound to improve size uniformity of the second compound.

Specifically, the seed and the core may include first to third elements respectively selected from the XIII group elements and the XV group elements in the periodic table. For example, the first and third elements may form a first compound of the XIII-XV group, the second and third elements may form a second compound, which is different from the first compound, of the XIII-XV group. The first element may be gallium (Ga), the second element may be indium (In), and the third element may be phosphorus (P). Namely, the first compound of the XIII-XV group may be GaP, and the second compound of the XIII-XV group may be InP. A first compound layer of the first compound may be enclosed with a second compound layer of the second compound.

The width of the seed may be 1-100 nm, and/or the width of the QD with a core enclosing the seed may be 1-100 nm.

In the third embodiment of the present disclosure, the core grows using the seed, which allows improvement in uniformity of core sizes and color purity of the QDs compared to when the cores are formed without the seed. For example, when the InP core grows without the GaP seed as the QDs in the first and second embodiments of the present disclosure, the size of the InP core depends on the reaction time and/or the reaction temperature. As a result, it is very difficult to obtain uniform size InP cores such that the color purity is decreased. However, in the third embodiment of the present disclosure, since the InP core grows using the GaP seed, uniform size InP cores are provided such that the color purity of the QD is improved.

The QD according to the third embodiment of the present disclosure may also include a first shell enclosing the seed and the core, the first shell including fourth and fifth elements respectively selected from the XII group elements and the XVI group elements in the periodic table. For example, the fourth and fifth elements may form a third compound of the XII-XVI group.

The fourth element may be zinc (Zn), and the fifth element may be sulfur (S). Namely, the third compound of the XII-XVI group may be ZnS, and the second compound layer may be enclosed with a third compound layer of the third compound. Namely, the second compound layer may be positioned between the first and third compound layers. The width of the quantum dot including the first shell, the core, and the seed may be 1-100 nm.

Since the QD of the third embodiment of the present disclosure may include the InP core instead of the CdSe core, the harmful problem of the related art QD is overcome.

Synthesis of QD $GaCl_3$ (0.25 mmol), tris(trimethylsilyl)phosphine (0.25 mmol) and 1-octadecene (3 mL) were mixed to form a Ga—P nucleus. (Clear yellow solution was changed into gray solution with Ga—P nucleus growth.)

$InR_3$ (R=palmitic acid, 1 mmol) and 1-octadecene (50 mL) were put into the mixture in the 250 mL flask, and the mixture was stirred under the temperature of 300° C. for 10 minutes. Tris(trimethylsilyl)phosphine (1 mmol) was injected into the mixture under the temperature of 300° C. to grow for 30 minutes. After the solution became black, 1-dodecanethiol (1 mmol) was injected and stirred under the temperature of 300° C. for 1 hour.

After cooling into the room temperature, $ZnR_3$ (R=Palmitic acid, 1 mmol) were injected and stirred under the temperature of 250° C. for 2 hours. After completion of stirring, 1-dodecanethiol was injected and stirred under the temperature of 250° C. for 2 hours.

After completion of the reaction, the mixture was cooled into room temperature. The mixture was purified by the precipitation method using toluene and methanol such that the QD was obtained.

Figure 4A:
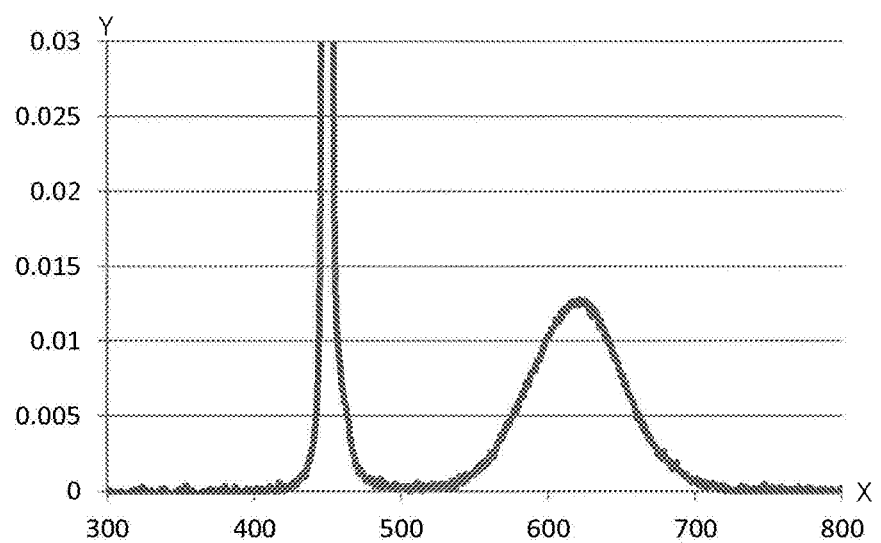
FIGS. 4A and 4B are views showing properties and components of a QD according to a third embodiment of the present disclosure.
Figure 4B:
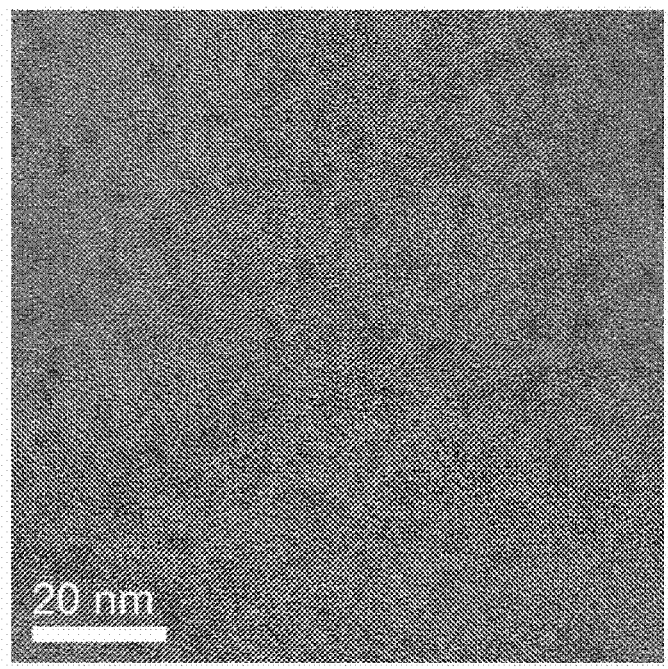

The x-axis of FIG. 4A indicates the wavelength of the luminescence in nm, and the y-axis of FIG. 4A indicates the photoluminescence intensity. FIG. 4A is a photoluminescence (PL) spectrum of the QD, and FIG. 4B is a transmission electron microscopy (TEM) of the QD.

As shown in FIG. 4A, the QD emits the visible light of the red wavelength range

Namely, the example QD includes the first to third elements, which are respectively selected from the XIII group elements and the XV group elements, and the fourth and fifth elements, which are respectively selected from the XII group elements and the XVI group elements, without Cd and emits the red visible light.

The STEM/EDS component analysis data are listed in Table 3. The X-Max 80 TLE apparatus is used in the analysis. When the constant value in Table 3 is larger than 1.5, the element is detected.

TABLE 3

|  | In | P | Zn | S | Se | Ga |
|---|---|---|---|---|---|---|
| Kα, Lα | 24.029, 3.286 | 2.013 | 8.637, 1.012 | 2.037 | 11.220, 1.379 | 9.250, 1.093 |
| Count/base | —, 31/2 | 28/2 | 16/2, 62/2 | 30/2 | — | 7/2, 56/2 |
| constant | —, 15.5 | 14 | 8, 31 | 15 | — | 3.5, 28 |

Referring to FIG. 4A, the FWHM of the PL spectrum of the example QD according to the third embodiment of the present disclosure is reduced in comparison to that of the QD according to the second embodiment of the present invention. However, since the FWHM of the example QD according to the third embodiment of the present disclosure is broader that the related art Cd-containing QD, there is still disadvantage in the color purity. In addition, the quantum efficiency (quantum yield) of the example QD according to the third embodiment of the present disclosure is reduced in comparison to that of the QD according to the second embodiment of the present disclosure.

A QD according to the fourth embodiment of the present disclosure includes the seed and the core enclosing the seed as described in reference to the third embodiment of the present disclosure. Similarly to the third embodiment, the seed of the first compound is used to grow the core of the second compound to improve size uniformity of the second compound.

As in the third embodiment, the seed and the core may include first to third elements respectively selected from the XIII group elements and the XV group elements in the periodic table. The first and third elements may form a first compound of the XIII-XV group, the second and third elements may form a second compound, which is different from the first compound, of the XIII-XV group. The first element may be gallium (Ga), the second element may be indium (In), and the third element may be phosphorus (P). Namely, the first compound of the XIII-XV group may be GaP, the second compound of the XIII-XV group may be InP. A first compound layer of the first compound may be enclosed with a second compound layer of the second compound.

The QD according to the fourth embodiment of the present disclosure further includes a first shell enclosing the seed and the core, and a second shell enclosing the first shell. The first shell and the second shell may include fourth to sixth elements respectively selected from the XII group elements and the XVI group elements in the periodic table. The fourth and fifth elements may form a third compound of the XII-XVI group, and the fourth and sixth elements may form a fourth compound, which is different from the first compound, of the XII-XVI group.

The fourth element may be zinc (Zn), and the fifth element may be selenium (Se), and the sixth element may be sulfur (S). Namely, the third compound of the XII-XVI group may be ZnSe, and the fourth compound of the XII-XVI group may be ZnS. The second compound layer may be enclosed with a third compound layer of the third compound, and the third compound layer may be enclosed with a fourth compound layer of the fourth compound in the fourth embodiment of the present disclosure. Namely, the second compound layer may be positioned between the first and fourth compound layers, and the third compound layer may be positioned between the second and fourth compound layers. The width of the quantum dot including the second shell, the first shell, the core, and the seed may be 1-100 nm.

Figure 6:
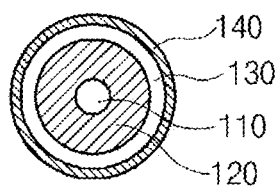
FIG. 6 is a schematic view illustrating a QD according to the fourth embodiment of the present disclosure.

Referring to FIG. 6, which is a schematic view illustrating an example QD according to the present disclosure, the example QD 100 according to the fourth embodiment of the present disclosure includes a seed (a first inner portion) 110 of GaP as the first compound of the XIII-XV group, a core (a second inner portion) 120 of InP as the second compound of the XIII-XV group, a first shell (a first outer portion) 130 of ZnSe as the third compound of XII-XVI group and a second shell (a second outer portion) 140 of ZnS as the fourth compound of XII-XVI group. The core encloses the seed, the first shell encloses the core, and the second shell encloses the first shell. Although not shown, an organic ligand may be coupled or linked to a surface of the second shell 140.

Namely, since the example QD of the fourth embodiment of the present disclosure includes the InP core instead of the CdSe core, the harmful problem of the related art QD is overcome. In addition, since the InP core grows from the surface of the GaP seed, a size (e.g., a diameter) of the InP core is controlled according to the injection amounts of the In element and P element such that the color purity is improved.

As previously discussed, when the InP core grows without the GaP seed as the QDs in the first and second embodiments of the present disclosure, the size of the InP core depends on the reaction time and/or the reaction temperature. As a result, it is very difficult or impossible to obtain uniform size InP cores such that the color purity is decreased. However, in the fourth embodiment of the present disclosure, since the InP core grows using the GaP seed, uniform size InP cores are provided such that the color purity of the QD is improved.

In addition, since dual shells of ZnS and ZnSe cover the InP core, the emitting efficiency of the QD is increased.

Synthesis of QD $GaCl_3$ (0.25 mmol), tris(trimethylsilyl)phosphine (0.25 mmol) and 1-octadecene (3 mL) were mixed to form a Ga—P nucleus. (Clear yellow solution was changed into gray solution with Ga—P nucleus growth.)

InR$_3$ (R=palmitic acid, 1 mmol) and 1-octadecene (50 mL) were put into the mixture in the 250 mL flask, and the mixture was stirred under the temperature of 300° C. for 10 minutes. Tris(trimethylsilyl)phosphine (1 mmol) was injected into the mixture under the temperature of 300° C. to grow for 30 minutes. After the solution became black, 1-dodecanethiol (1 mmol) was injected and stirred for 1 minute. Se-trioctylphoshpine (Se-TOP, 0.1 mmol) was additionally injected and stirred under the temperature of 300° C.

After cooling into the room temperature, ZnR$_3$ (R=Palmitic acid, 1 mmol) were injected and stirred under the temperature of 250° C. for 2 hours. After completion of stirring, 1-dodecanethiol was injected and stirred under the temperature of 250° C. for 2 hours.

After completion of the reaction, the mixture was cooled into room temperature. The mixture was purified by the precipitation method using toluene and methanol such that the QD was obtained.

Figure 5A:
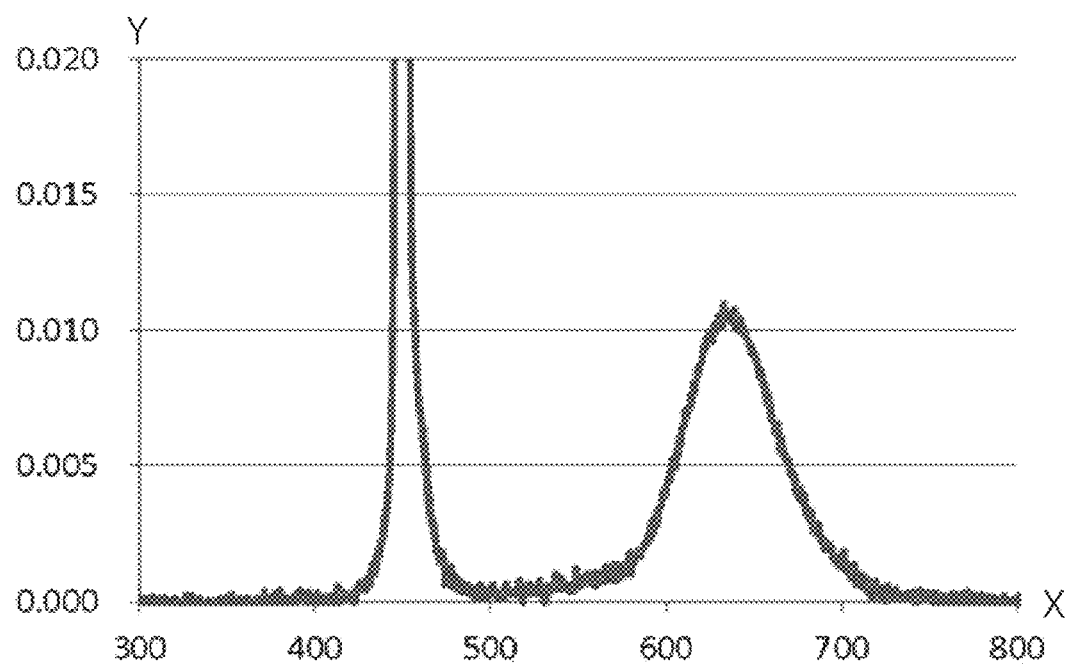
FIGS. 5A and 5B are views showing properties and components of a QD according to a fourth embodiment of the present disclosure.
Figure 5B:
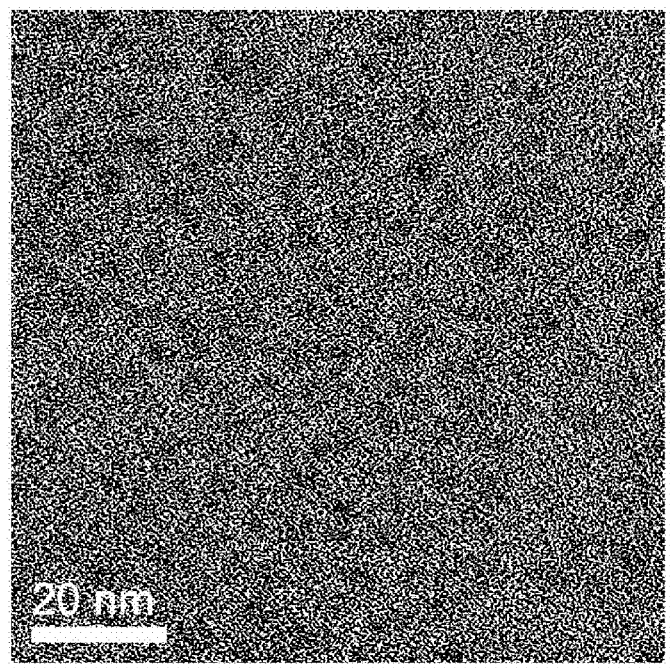

The x-axis of FIG. 5A indicates the wavelength of the luminescence in nm, and the y-axis of FIG. 5A indicates the photoluminescence intensity. FIG. 5A is a photoluminescence (PL) spectrum of the QD, and FIG. 5B is a transmission electron microscopy (TEM) of the QD.

As shown in FIG. 5A, the QD emits the visible light of the red wavelength range.

Namely, the QD includes the first to third elements, which are respectively selected from the XIII group elements and the XV group elements, and the fourth to sixth elements, which are respectively selected from the XII group elements and the XVI group elements, without Cd and emits the red visible light.

In other words, the QD includes the first compound consisting of at least two of the first to third elements, the second compound, which is different from the first compound, consisting of at least two of the first to third elements and the third compound consisting of at least two of the fourth to sixth elements. The QD may further include the fourth compound, which is different from the third compound, consisting of at least two of the fourth to sixth elements.

The STEM/EDS component analysis data are listed in Table 4. The X-Max 80 TLE apparatus is used in the analysis. When the constant value in Table 4 is larger than 1.5, the element is detected.

TABLE 4

|  | In | P | Zn | S | Se | Ga |
|---|---|---|---|---|---|---|
| Kα, Lα | 24.029, 3.286 | 2.013 | 8.637, 1.012 | 2.037 | 11.220, 1.379 | 9.250, 1.093 |
| Count/ base | —, 38/2 | 41/2 | 14/2, 80/2 | 51/2 | 8/2, 22/2 | 18/2, 65/2 |
| constant | —, 19 | 20.5 | 7, 40 | 25.5 | 4, 11 | 9, 32.5 |

Referring to FIG. 5A, the FWHM of the PL spectrum of the example QD according to the fourth embodiment of the present disclosure is narrowed in comparison to that of the QD according to the first to third embodiments of the present disclosure. Accordingly, the example QD according to the fourth embodiment of the present disclosure emits the light of high color purity without the Cd element. In addition, the example QD according to the fourth embodiment of the present disclosure has high quantum efficiency.

The peak of the PL spectrum (PL peak), the FWHM value and the quantum yield (QY) of the example QDs according to the first to fourth embodiments of the present disclosure are listed in Table 5.

TABLE 5

|  | 1st embodiment | 2nd embodiment | 3rd embodiment | 4th embodiment |
|---|---|---|---|---|
| PL peak | 619.1 nm | 635.7 nm | 621.3 nm | 633.0 nm |
| FWHM | 103.0 nm | 73.6 nm | 71.3 nm | 59.1 nm |
| QY | 10.4% | 68.7% | 31.0% | 74.9% |

As shown in Table 5, the example QD according to the fourth embodiment of the present disclosure, which includes the first compound of the XIII-XV group, the second compound, which is different from the first compound, of the XIII-XV group, the third compound of the XII-XVI group and the fourth compound, which is different from the third compound, of the XII-XVI group, has narrow FWHM and high quantum yield. As a result, in the QD according to the fourth embodiment of the present disclosure, the color purity is improved, and the emitting efficiency is increased.

Figure 7:
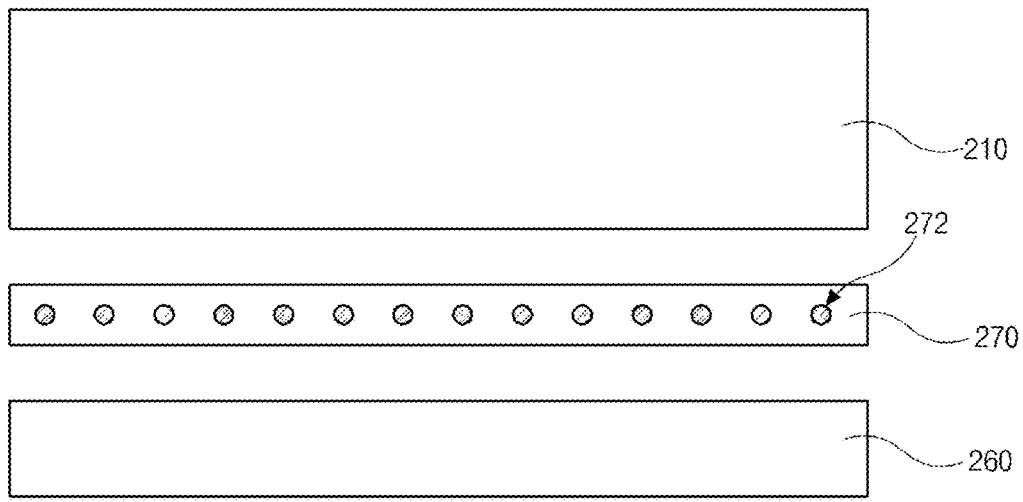
FIG. 7 is a schematic cross-sectional view of a QD film and a liquid crystal display device according to an embodiment of the present disclosure.
Figure 8:
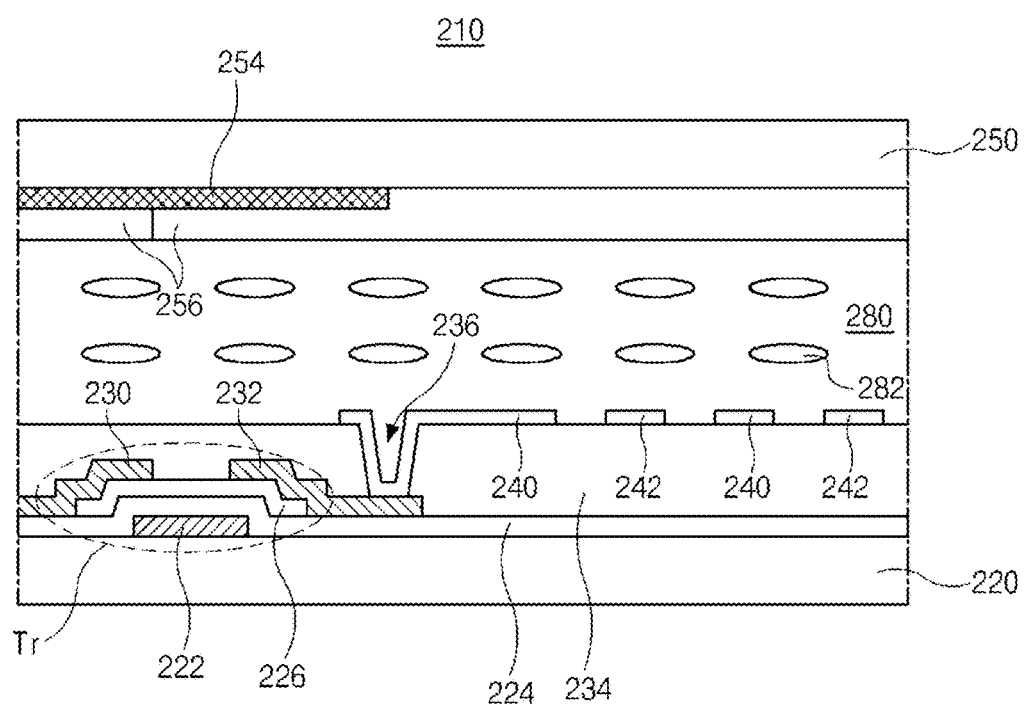
FIG. 8 is a schematic cross-sectional view of a liquid crystal panel according to an embodiment of the present disclosure.

FIG. 7 is a schematic cross-sectional view of a QD film and a liquid crystal display device according to an embodiment of the present disclosure, and FIG. 8 is a schematic cross-sectional view of a liquid crystal panel.

As shown in FIG. 7, the liquid crystal display (LCD) device 200 as a display device of the present disclosure includes a liquid crystal panel 210, a backlight unit 260 under the liquid crystal panel 210 and a QD film 270 between the liquid crystal panel 210 and the backlight unit 260.

Referring to FIG. 8, the liquid crystal panel 210 includes first and second substrates 220 and 250 facing each other and a liquid crystal layer 280 including liquid crystal molecules 282 disposed between the first and second substrates 220 and 250.

A gate electrode 222 is formed on the first substrate 220, and a gate insulating layer 224 is formed to cover the gate electrode 222. In addition, a gate line (not shown) being connected to the gate electrode 222 is formed on the first substrate 220.

A semiconductor layer 226 corresponding to the gate electrode 222 is formed on the gate insulating layer 224. The semiconductor layer 226 includes an oxide semiconductor material. Alternatively, the semiconductor layer 226 may include an active layer of intrinsic amorphous silicon and an ohmic contact layer of impurity-doped amorphous silicon.

A source electrode 230 and a drain electrode 232 are formed on the semiconductor layer 226 to be spaced apart from each other. In addition, a data line (not shown), which is connected to the source electrode 230 and crosses the gate line to define a pixel region, is formed on the gate insulating layer 224.

The gate electrode 222, the semiconductor layer 226, the source electrode 230 and the drain electrode 232 constitute a thin film transistor (TFT) Tr.

A passivation layer 234, which includes a drain contact hole 236 exposing the drain electrode 232, is formed on the TFT Tr.

A pixel electrode 240, which is connected to the drain electrode 232 through the drain contact hole 236, and a common electrode 242, which is alternately arranged with the pixel electrode 240, are formed on the passivation layer 234.

A black matrix 254, shielding a non-display region, e.g., the TFT Tr, the gate line and the data line, is formed on the second substrate 250, and a color filter layer 256 corresponding to the pixel region is formed on the second substrate 250.

The first and second substrates 220 and 250 are attached with the liquid crystal layer 280 therebetween. The liquid crystal molecules 282 of the liquid crystal layer 280 are driven by an electric field between the pixel and common electrodes 240 and 242.

Although not shown, first and second alignment layers are formed over the first and second substrates 220 and 250 to be adjacent to the liquid crystal layer 280. In addition, first and second polarization plates, which have perpendicular transmission axes, are disposed at an outer side of the first and second substrates 220 and 250.

The backlight unit 260 includes a light source (not shown) and provides the light toward the liquid crystal panel 210.

The backlight unit 260 may be classified into a direct type and a side type according to a position of the light source, and the light source may be a fluorescent lamp or a light emitting diode (LED) package.

For example, the direct type backlight unit 260 may include a bottom frame (not shown) covering a rear side of the liquid crystal panel 210, and a plurality of light sources may be arranged on a horizontal bottom surface of the bottom frame.

The side type backlight unit 260 may include a bottom frame (not shown) covering a rear side of the liquid crystal panel 210 and a light guide plate (not shown) on or over a horizontal bottom surface of the bottom frame. The light source may be arranged at a side of the light guide plate.

When the light source is the LED package, the LED package may include a blue LED chip and a green fluorescent layer covering the blue LED chip.

The QD film 270 is positioned between the liquid crystal panel 210 and the backlight unit 260 and includes the QDs 272 according to the first to fourth embodiments of the present disclosure. As a result, the color purity of the light, which is provided from the backlight unit 260 toward the liquid crystal panel 210, is improved.

For example, the QD film 270 may include a binder, e.g., an epoxy compound or an acrylate compound, and the QD 272 including first to third elements selected from the XIII group elements and the XV group elements and fourth to sixth elements selected from the XII group elements and the XVI group elements. Namely, the QD 272 may include a first compound of the XIII-XV group, a second compound of the XIII-XV group, a third compound of the XII-XVI group and a fourth compound of the XII-XVI group. In this instance, the first compound may be GaP, the second compound may be InP, the third compound may be ZnSe, and the fourth compound may be ZnS.

Alternatively, when the LED package includes the blue LED package without the green fluorescent layer, the QD film 270 may include the QD 272 and the green fluorescent compound or the green QD.

As mentioned above, since the QD 272 including the first compound of the XIII-XV group, the second compound of the XIII-XV group, the third compound of the XII-XVI group and the fourth compound of the XII-XVI group has high color purity and quantum yield, the LCD device 200 of the present invention has high color reproductivity (color gamut) and provide high brightness image.

Figure 9:
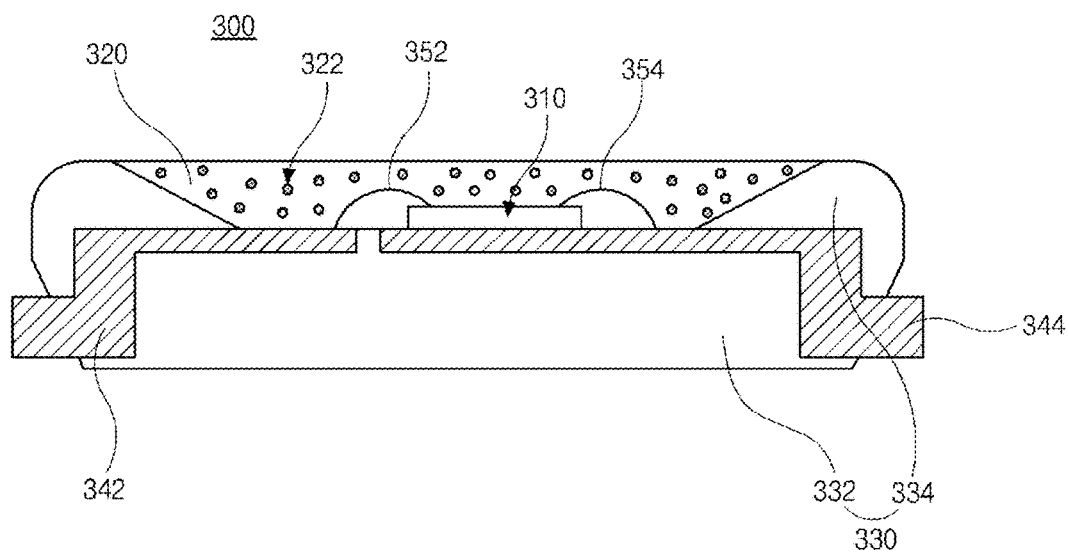
FIG. 9 is a schematic cross-sectional view of an LED package according to an embodiment of the present disclosure.

FIG. 9 is a schematic cross-sectional view of an LED package according to an embodiment of the present disclosure.

As shown in FIG. 9, the LED package 300 includes a case 330, an LED chip 310, first and second electrode leads 342 and 344, which are respectively connected to the LED chip 310 via first and second wires 352 and 354 and extend into an outside of the case 330, and an encapsulation part 320 covering the LED chip 310.

The case 330 includes a body 332 and a side wall 334 protruding from an upper surface of the body 332 and serving as a reflection surface. The LED chip 310 is arranged on the body 332 and is surrounded by the side wall 334.

The LED chip 310 is a blue LED chip, and the encapsulation part 320 includes a red QD 322 such that the LED package 300 provides high color purity light. Namely, the QD 322 in the encapsulation part 320 is at least one of the QDs according to one of the first to fourth embodiments of the present disclosure such that the color purity of the LED package 300 is improved.

For example, the QD 322 may include first to third elements selected from the XIII group elements and the XV group elements and fourth to sixth elements selected from the XII group elements and the XVI group elements. Namely, the QD 322 may include a first compound of the XIII-XV group, a second compound of the XIII-XV group, a third compound of the XII-XVI group and a fourth compound of the XII-XVI group. In this instance, the first compound may be GaP, the second compound may be InP, the third compound may be ZnSe, and the fourth compound may be ZnS.

The encapsulation part 320 may further include the green fluorescent compound (not shown) or the green QD (not shown).

As mentioned above, since the QD 322 including the first compound of the XIII-XV group, the second compound of the XIII-XV group, the third compound of the XII-XVI group and the fourth compound of the XII-XVI group has high color purity and quantum yield, the LED package 300 of the present disclosure provides high color purity light.

In addition, an embodiment of a liquid crystal display (LCD) device of the present disclosure may include a backlight unit including the LED package 300, and a liquid crystal panel on the backlight unit.

Figure 10:
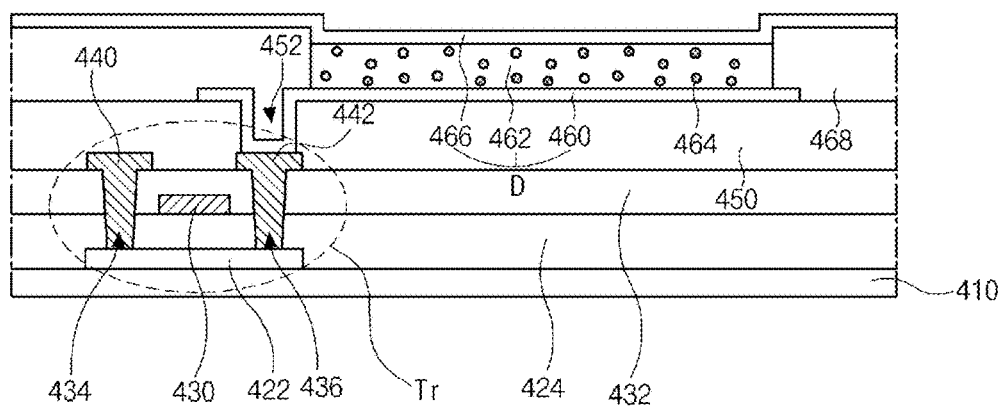
FIG. 10 is a schematic cross-sectional view of a QD light emitting diode display device according to an embodiment of the present disclosure.

FIG. 10 is a schematic cross-sectional view of a QD light emitting diode display device according to an embodiment of the present disclosure.

As shown in FIG. 10, the QD light emitting diode display device 400 as a display device of the present disclosure includes a substrate 410, a driving element Tr on or over the substrate 410 and an emitting diode D connected to the driving element Tr.

A semiconductor layer 422 is formed on the substrate 410. The semiconductor layer 422 may include an oxide semiconductor material or polycrystalline silicon.

When the semiconductor layer 422 includes the oxide semiconductor material, a light-shielding pattern (not shown) may be formed under the semiconductor layer 422. The light to the semiconductor layer 422 is shielded or blocked by the light-shielding pattern such that thermal degradation of the semiconductor layer 422 can be prevented. On the other hand, when the semiconductor layer 422 includes polycrystalline silicon, impurities may be doped into both sides of the semiconductor layer 422.

A gate insulating layer 424 is formed on the semiconductor layer 422. The gate insulating layer 424 may be formed of an inorganic insulating material such as silicon oxide or silicon nitride.

A gate electrode 430, which is formed of a conductive material, e.g., metal, is formed on the gate insulating layer 424 to correspond to a center of the semiconductor layer 422.

An interlayer insulating layer 432, which is formed of an insulating material, is formed on an entire surface of the substrate 410 including the gate electrode 430. The interlayer insulating layer 432 may be formed of an inorganic insulating material, e.g., silicon oxide or silicon nitride, or an organic insulating material, e.g., benzocyclobutene or photo-acryl.

The interlayer insulating layer 432 includes first and second contact holes 434 and 436 exposing both sides of the semiconductor layer 422. The first and second contact holes 434 and 436 are positioned at both sides of the gate electrode 430 to be spaced apart from the gate electrode 430.

A source electrode 440 and a drain electrode 442, which are formed of a conductive material, e.g., metal, are formed on the interlayer insulating layer 432. The source electrode 440 and the drain electrode 442 are spaced apart from each other with respect to the gate electrode 430 and respectively contact both sides of the semiconductor layer 422 through the first and second contact holes 434 and 436.

The semiconductor layer 422, the gate electrode 430, the source electrode 440 and the drain electrode 442 constitute the TFT Tr as a driving element.

In FIG. 10, the gate electrode 430, the source electrode 440, and the drain electrode 442 are positioned over the semiconductor layer 422. Namely, the TFT Tr has a coplanar structure. Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the substrate 410 and cross each other to define a pixel region. In addition, a switching element, which is electrically connected to the gate line and the data line, may be disposed on the substrate 410. The switching element is electrically connected to the TFT Tr as the driving element.

In addition, a power line, which is parallel to and spaced apart from the gate line or the data line, may be formed on or over the substrate 410. Moreover, a storage capacitor for maintaining a voltage of the gate electrode 430 of the TFT Tr during one frame, may be further formed on the substrate 410.

A passivation layer 450, which includes a drain contact hole 452 exposing the drain electrode 442 of the TFT Tr, is formed to cover the TFT Tr.

A first electrode 460, which is connected to the drain electrode 442 of the TFT Tr through the drain contact hole 452, is separately formed in each pixel region. The first electrode 460 may be an anode and may be formed of a conductive material having a relatively high work function. For example, the first electrode 460 may be formed of a transparent conductive material such as indium-tin-oxide (ITO) or indium-zinc-oxide (IZO).

When the QD light emitting diode display device 400 is operated in a top-emission type, a reflection electrode or a reflection layer may be formed under the first electrode 460. For example, the reflection electrode or the reflection layer may be formed of aluminum-paladium-copper (APC) alloy.

A bank layer 468, which covers edges of the first electrode 460, is formed on the passivation layer 450. A center of the first electrode 460 in the pixel region is exposed through an opening of the bank layer 468.

A QD emitting layer 462 including a QD 464 according to one of the first to fourth embodiments of the present disclosure is formed on the first electrode 460.

For example, the QD 464 of the QD emitting layer 462 may include first to third elements selected from the XIII group elements and the XV group elements and fourth to sixth elements selected from the XII group elements and the XVI group elements. Namely, the QD 464 may include a first compound of the XIII-XV group, a second compound of the XIII-XV group, a third compound of the XII-XVI group and a fourth compound of the XII-XVI group. In this instance, the first compound may be GaP, the second compound may be InP, the third compound may be ZnSe, and the fourth compound may be ZnS.

To improve emitting efficiency, a hole injection layer and a hole transporting layer may be sequentially stacked between the first electrode and the QD emitting layer 462, and an electron transporting layer and an electron injection layer may be sequentially stacked on the QD emitting layer 462.

A second electrode 466 is formed over the substrate 410 including the QD emitting layer 462. The second electrode 466 is positioned at an entire surface of the display area. The second electrode 466 may be a cathode and may be formed of a conductive material having a relatively low work function. For example, the second electrode 466 may be formed of aluminum (Al), magnesium (Mg) or Al—Mg alloy.

The first electrode 460, the QD emitting layer 462 and the second electrode 466 constitute the organic emitting diode D.

As mentioned above, since the QD 464 including the first compound of the XIII-XV group, the second compound of the XIII-XV group, the third compound of the XII-XVI group and the fourth compound of the XII-XVI group has high color purity and quantum yield, the QD light emitting diode display device 400 of the present disclosure has high color reproductivity (color gamut) and provides a high-brightness image.

Figure 11:
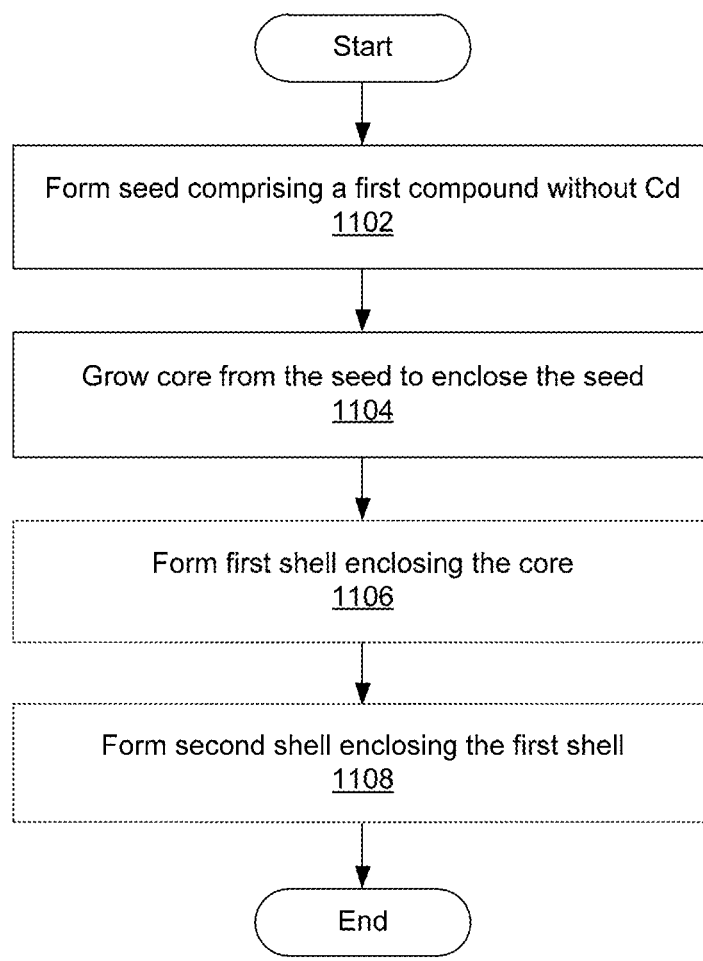
FIG. 11 illustrates a process of manufacturing a QD, according to an embodiment of the present disclosure.

FIG. 11 illustrates a process of manufacturing a QD, according to an embodiment of the present disclosure.

A seed including a first compound without Cd is formed 1102. The first compound may include a compound of the XIII-XV group, specifically GaP. A core is grown 1104 from the seed. The core may be of a second compound of the XIII-XV group, such as InP. Optionally, a first shell of a third compound enclosing the core may be formed 1106. The third compound may include a compound of the XII-XVI group, such as ZnSe or ZnS. Optionally, a second shell of a fourth compound enclosing the first shell may be formed 1108. The fourth compound may include a compound of the XII-XVI group. Specifically, when the third compound is ZnSe, the fourth compound may be ZnS.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:
1. A quantum dot comprising:
a seed comprising a first compound without Cd; and
a core enclosing the seed and comprising a second compound,
wherein the first compound comprises a first element from group XIII and a second element from group XV and is different from the second compound, and the second compound consists of InP.

2. The quantum dot of claim 1, wherein the first compound comprises GaP.

3. The quantum dot of claim 1, further comprising a first shell enclosing the core, the first shell comprising a third compound without Cd, the third compound different from the second compound.

4. The quantum dot of claim 3, wherein the third compound comprises a third element from group XII and a fourth element from group XVI.

5. The quantum dot of claim 4, wherein the third compound comprises Zn or S.

6. The quantum dot of claim 3, further comprising a second shell between the first shell and the core, the second shell comprising a fourth compound without Cd, the fourth compound different from the third compound.

7. The quantum dot of claim 6, wherein the fourth compound comprises a third element from group XII and a fourth element from group XVI.

8. The quantum dot of claim 7, wherein the fourth compound comprises Zn or Se.

9. The quantum dot of claim 1, wherein a width of the quantum dot is 1-100 nm.

10. A method of manufacturing a quantum dot, the method comprising:
forming a seed comprising a first compound without Cd; and
growing a core from the seed to enclose the seed, the core comprising a second compound,
wherein the first compound comprises a first element from group XIII and a second element from group XV and is different from the second compound, and the second compound consists of InP.

11. The method of claim 10, wherein the first compound comprises GaP.

12. The method of claim 10, further comprising forming a first shell enclosing the core, the first shell comprising a third compound without Cd, the third compound different from the second compound.

13. The method of claim 12, further comprising forming a second shell enclosing the first shell, the second shell comprising a fourth compound without Cd, the fourth compound different from the third compound.

14. A quantum dot film comprising:
a binder;
a quantum dot in the binder, the quantum dot comprising:
a seed comprising a first compound without Cd; and
a core enclosing the seed and comprising a second compound,
wherein the first compound comprises a first element from group XIII and a second element from group XV and is different from the second compound, and the second compound consists of InP.

15. The quantum dot film of claim 14, wherein the first compound comprises GaP.

16. The quantum dot film of claim 14, further comprising a first shell enclosing the core, the first shell comprising a third compound without Cd, the third compound different from the second compound.

17. The quantum dot film of claim 16, further comprising a second shell between the first shell and the core, the second shell comprising a fourth compound without Cd, the fourth compound different from the third compound.

18. A liquid crystal display (LCD) device comprising:
a backlight unit configured to emit light;
a quantum dot film disposed on the backlight unit, the quantum dot film comprising a quantum dot, the quantum dot comprising;
a seed comprising a first compound without Cd;
a core enclosing the seed and comprising a second compound; and
a liquid crystal panel disposed on the quantum dot film,
wherein the first compound comprises a first element from group XIII and a second element from group XV and is different from the second compound, and the second compound consists of InP.

19. The LCD device of claim 18, wherein the first compound comprises GaP.

20. The LCD device of claim 18, further comprising a first shell enclosing the core, the first shell comprising a third compound without Cd, the third compound different from the second compound.

21. The LCD device of claim 20, further comprising a second shell between the first shell and the core, the second shell comprising a fourth compound without Cd, the fourth compound different from the third compound.

22. A light emitting diode (LED) package comprising:
a LED chip; and
an encapsulation part covering the LED chip and including a quantum dot, the quantum dot comprising;
a seed comprising a first compound without Cd; and
a core enclosing the seed and comprising a second compound,
wherein the first compound comprises a first element from group XIII and a second element from group XV and is different from the second compound, and the second compound consists of InP.

23. The LED package of claim 22, wherein the first compound comprises GaP.

24. The LED package of claim 22, further comprising a first shell enclosing the core, the first shell comprising a third compound without Cd, the third compound different from the second compound.

25. The LED package of claim 24, further comprising a second shell between the first shell and the core, the second shell comprising a fourth compound without Cd, the fourth compound different from the third compound.

26. A liquid crystal display (LCD) device comprising:
a backlight unit including a light emitting diode (LED) chip and an encapsulation part covering the LED chip, the encapsulation part including a quantum dot, the quantum dot comprising;
a seed comprising a first compound without Cd;
a core enclosing the seed and comprising a second compound; and
a liquid crystal panel on the backlight unit,
wherein the first compound comprises a first element from group XIII and a second element from group XV and is different from the second compound, and the second compound consists of InP.

27. The LCD device of claim 26, wherein the first compound comprises GaP.

28. The LCD device of claim 26, further comprising a first shell enclosing the core, the first shell comprising a third compound without Cd, the third compound different from the second compound.

29. The LCD device of claim 28, further comprising a second shell between the first shell and the core, the second shell comprising a fourth compound without Cd, the fourth compound different from the third compound.

30. A light emitting diode display device comprising:
a substrate;
a thin film transistor (TFT) on the substrate;
a light emitting diode electrically connected to the TFT, the light emitting diode comprising:

a first electrode connected to the TFT;

a quantum dot (QD) emitting layer on the first electrode, the QD emitting layer comprising a quantum dot, the quantum dot comprising:

a seed comprising a first compound without Cd;

a core enclosing the seed and comprising a second compound; and a second electrode on the organic light emitting layer, wherein the first compound comprises a first element from group XIII and a second element from group XV and is different from the second compound, and the second compound consists of InP.

31. The light emitting diode display device of claim 30, wherein the first compound comprises GaP.

32. The OLED display device of claim 30, further comprising a first shell enclosing the core, the first shell comprising a third compound without Cd, the third compound different from the second compound.

33. The OLED display device of claim 32, further comprising a second shell between the first shell and the core, the second shell comprising a fourth compound without Cd, the fourth compound different from the third compound.

34. The quantum dot of claim 1, wherein the first compound is GaP.

35. The method of claim 10, wherein the first compound is GaP.

36. The quantum dot film of claim 14, wherein the first compound is GaP.

37. The LCD device of claim 18, wherein the first compound is GaP.

38. The LED package of claim 22, wherein the first compound is GaP.

39. The LCD device of claim 26, wherein the first compound is GaP.

40. The light emitting diode display device of claim 30, wherein the first compound is GaP.

* * * * *